Oct. 25, 1966 L. A. HARWOOD 3,281,699

INSULATED-GATE FIELD-EFFECT TRANSISTOR OSCILLATOR CIRCUITS

Filed Feb. 25, 1963 4 Sheets-Sheet 1

INVENTOR.
LEOPOLD A. HARWOOD
BY Eugene M. Whitacre
ATTORNEY

INSULATED-GATE FIELD-EFFECT TRANSISTOR OSCILLATOR CIRCUITS

Filed Feb. 25, 1963

4 Sheets-Sheet 2

INVENTOR.
LEOPOLD A. HARWOOD
BY
Eugene M. Whitacre
ATTORNEY

INVENTOR.
LEOPOLD A. HARWOOD
BY Eugene M. Whitacre
ATTORNEY

INSULATED-GATE FIELD-EFFECT TRANSISTOR OSCILLATOR CIRCUITS

Filed Feb. 25, 1963 4 Sheets-Sheet 4

INVENTOR.
LEOPOLD A. HARWOOD
BY Eugene M. Whitacre
ATTORNEY 3,281,699

INSULATED-GATE FIELD-EFFECT TRANSISTOR OSCILLATOR CIRCUITS

Leopold A. Harwood, Cherry Hill, N.J., assignor to Radio Corporation of America, a corporation of Delaware
Filed Feb. 25, 1963, Ser. No. 260,451
19 Claims. (Cl. 325—440)

This invention relates to electrical oscillation generators and more particularly to oscillators including semiconductor devices.

In tube and junction transistor types of prior art oscillators, the oscillations produced tend to be self-stabilizing in amplitude. For example, in tube type oscillators, the tube oscillates between plate current cut off and grid current loading. If, in such an oscillator, a grid bias is applied between the grid and cathode, the grid bias locally produced by grid rectification adjusts itself to the point where the tube continues to operate between plate cut off and grid current loading, and the amplitude of oscillations is not substantially changed by the applied grid bias. A similar effect appears in a transistor type oscillator, since it oscillates between transistor cut off and transistor saturation, even though the static transistor emitter to base circuit conditions are changed. Therefore, in tube or junction transistor types of oscillators, the amplitude of oscillations tends to remain constant in spite of static changes in grid bias voltage or emitter bias current.

Although circuits have heretofore been devised for adjusting the amplitude of oscillations of a given oscillator, such circuits either deleteriously affect the operation of the oscillator in terms of frequency stability or power capability, or require additional circuit elements which add to the cost and complexity of the oscillator.

It is therefore an object of this invention to provide an oscillator in which the amplitude of oscillations may be established as a function of the design of the bias circuit of the active element of the circuit.

It is a further object of this invention to provide an improved oscillator whose amplitude of oscillations may readily be adjusted.

It is a further object of this invention to provide an improved and simplified self-starting oscillator including an insulated-gate field-effect transistor.

According to an embodiment of this invention, the source, drain and gate electrodes of an insulated-gate field-effect transistor are interconnected by circuit means so that the transistor operates as a self-starting oscillator. Means are provided for establishing the amplitude of oscillations of said oscillator at a predetermined desired level comprising a biasing circuit between the gate and source electrodes. Due to the mechanism of oscillation, as hereinafter will be discussed, the particular bias voltage (including zero voltage) between the gate and source electrodes establishes the amplitude of oscillation. Accordingly, an oscillator having a desired amplitude of oscillatory wave output voltage may be provided by the application of an appropriate bias between the gate and source electrodes.

In accordance with a feature of this invention, the gate-to-source bias voltage may be made adjustable to control the amplitude of oscillations. Such a circuit is useful in multi-band superheterodyne receivers, in which, for optimum operation, it may be advantageous to control the amplitude of the locally produced oscillations for different frequency bands of operation.

In another embodiment of the invention, the oscillator may be operated as an amplitude modulator by applying a modulating signal between the gate and the source electrode.

In a further embodiment of the invention, the oscillator may be connected as a self-oscillating frequency converter circuit.

A still further embodiment of this invention comprises an oscillator in which the active element is an insulated-gate field-effect transistor whose gate electrode is maintained at zero bias potential with respect to the source electrode.

In a further embodiment, the oscillator may operate as a memory circuit in that the amplitude of oscillations continues at an amplitude determined by a momentarily applied bias pulse.

The novel features which are considered to be characteristic of this invention are set forth with particularity in the appended claims. The invention itself, however, both as to its organization and method of operation will best be understood from the following descriptions when read in conjunction with the accompanying drawing in which:

Figures 1, 2:
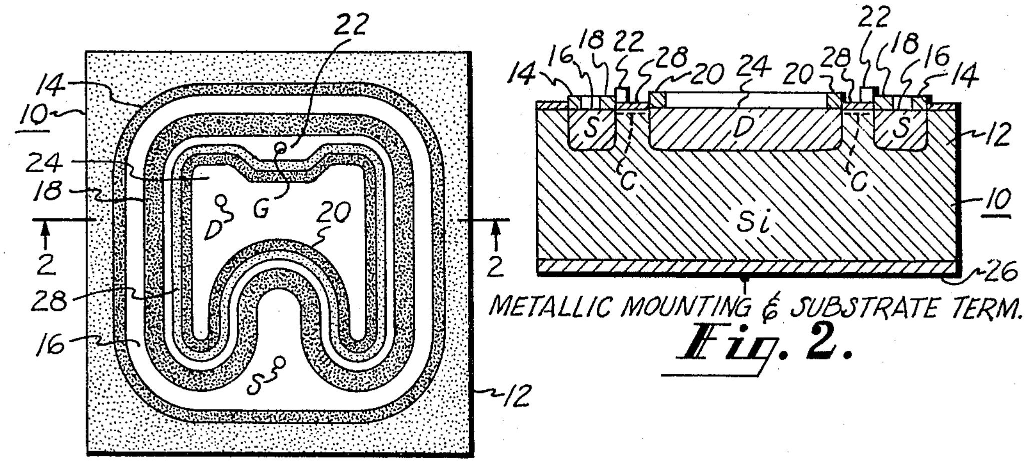
FIGURE 1 is a diagrammatic view of a field-effect transistor suitable for use in circuits embodying the invention.
FIGURE 2 is a sectional view taken along section line 2—2 of FIGURE 1.

Referring now to the drawing and more particularly to FIGURE 1, a field-effect transistor 10 which may be used with the circuits embodying the invention includes a body 12 of semiconductor material. The body 12 may be either a single crystal or polycrystalline and may be of any of the semiconductor materials used to prepare transistors in the semiconductor art. For example, the body 12 may be nearly intrinsic silicon, such as for example, lightly doped P-type silicon of 500 to 1000 ohm cm. material.

In the manufacture of a device shown in FIGURE 1, heavily doped silicon dioxide is deposited over the surface of the silicon body 12. The silicon dioxide is doped with N-type impurities. By means of a photo-resist and acid etching, or other suitable technique, the silicon dioxide is removed in the area where the gate electrode is to be formed, and around the outer edges of the silicon wafer as viewed on FIGURE 1. The deposited silicon dioxide is left undisturbed over those areas where the source-drain regions are to be formed.

The body 12 is then heated in a suitable atmosphere such as in water vapor so that exposed silicon areas are oxidized to form grown silicon dioxide layers indicated by the stippled areas of FIGURE 1. During the heating process, impurities from the deposited silicon dioxide layer diffuse into silicon body 12 to form the source and drain regions. FIGURE 2, which is a cross section view taken along section line 2—2 of FIGURE 1, shows the source-drain regions labeled S and D respectively.

By means of another photo-resist and acid etching or like step, the deposited silicon dioxide over part of the source-drain diffused regions is removed. Electrodes are formed for the source, drain and gate regions by evaporation of a conductive material by means of an evaporation mask. The conductive material evaporated may be chromium and gold in the order named, for example, but other suitable metals may be used.

The finished wafer is shown in FIGURE 1, in which the stippled area between the outside boundary and the first dark zone 14 is grown silicon dioxide. The white area 16 is the metal electrode corresponding to the source electrode. Dark zones 14 and 18 are deposited silicon dioxide zones overlying a portion of the diffused source region and the dark zone 20 is a deposited silicon dioxide zone overlying a portion of the diffused drain region. White areas 22 and 24 are the metallic electrodes which correspond to the gate and drain electrodes respectively. The stippled zone 28 is a layer of grown silicon dioxide on a portion of which the gate electrode 22 is placed and which insulates the gate electrode 22 from the substrate silicon body 12 and from the source and drain electrodes as shown in FIGURE 2. The silicon wafer is mounted on a conductive base or header 26 as shown in FIGURE 2.

The layer of grown silicon dioxide 28 on which the gate electrode 22 is mounted, overlies an inversion layer or conducting channel C, shown in dotted lines, connecting the source and drain regions. The gate electrode 22 is displaced towards the source region S so that the distance between the source region S and the gate electrode 22 is smaller than the distance between the gate electrode 22 and the drain region D. If desired the gate electrode may slightly overlap the deposited silicon dioxide layer 18 above the source electrode. It will be noted that the transistor is symmetrical, other than for the offset gate electrode, and that either of the electrodes D and S operate as the drain and the source electrodes as a function of the polarity of the bias potential applied therebetween; i.e. the electrode to which a positive potential is applied relative to the other electrode operates as a drain electrode and the other electrode operates as a source electrode.

The input resistance of the transistor described above between the gate and another electrode is very high, measuring on the order of $10^{14}$ ohms at D.-C., and is independent of the direction of application of voltage between the gate and the drain or the source. The D.-C. resistance of the transistor between source and drain is independent of the direction of current flow, and while it varies with the voltage applied to the gate with respect to the source, it is in the order of several hundred to over a thousand ohms.

Figure 3:
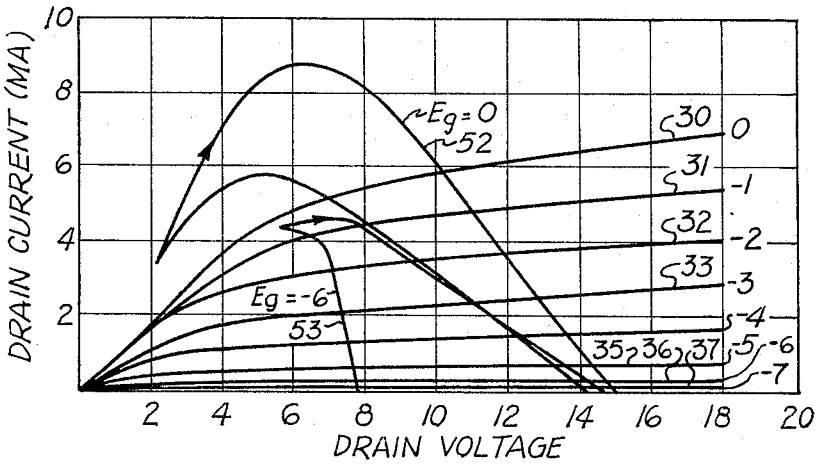
FIGURE 3 is a graph showing a family of drain current versus drain voltage curves for various values of gate-to-source bias voltages for the transistor of FIGURE 1, as well as load lines of an oscillator operating at various gate bias voltages.

FIGURE 3 is a family of curves 30–37 illustrating the drain current versus drain voltage characteristic of the transistor of FIGURE 1 for different values of gate-to-source voltage. A feature of an insulated-gate field-effect transistor is that the zero bias characteristic can be at any of the curves 30–37. In FIGURE 3 the curve 30 corresponds to the zero bias gate-to-source voltage. Curves (not shown) above curve 30 represent positive gate voltages relative to the source and the curves 31–37 represent negative gate voltages relative to the source. The location of the zero bias curve is selected during the manufacture of the transistor by controlling the time and/or temperature of the step of the process when the silicon dioxide layer 28 shown in FIGURES 1 and 2 is grown.

It will be noted that the bias curve 37 indicate substantially zero drain current, hence for bias voltages of 7 volts or of greater negative voltage, the transistor may be regarded as being cut-off. Although not shown, curves representing successively higher positive gate bias become closer together and indicate approach to current saturation of this internal path. Where the curve representing zero gate bias of the transistor is at a relatively high drain current, the transistor is called a depletion type transistor. Conversely, where the curve representing zero bias is at very low drain current, the transistor is called an enhancement type transistor. FIGURE 3 also shows load lines 52 and 53, to be described.

Figure 4:
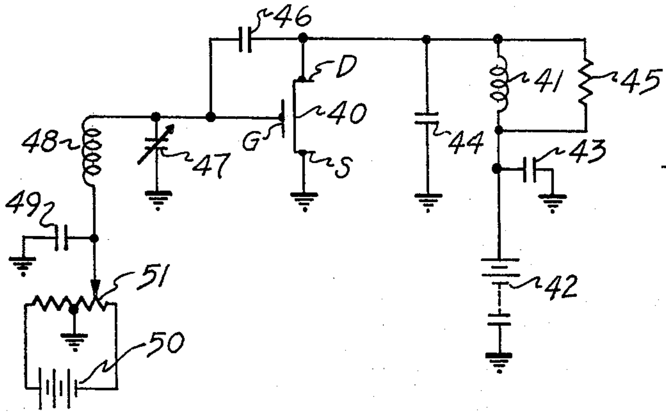
FIGURE 4 is a schematic diagram of an oscillator circuit embodying the invention.

In the oscillator of FIGURE 4, the source S of the insulated-gate field-effect transistor 40 is connected directly to ground. The drain D of this transistor 40 is connected to the positive terminal of a voltage supply source 42 through an inductor 41. The inductor 41 is tuned to the desired oscillator frequency by a capacitor 44 which is effectively connected in parallel therewith. The oscillator load is represented by a resistor 45 connected in parallel with the inductor 41. It will be understood that the oscillator load circuit may be capacitively or inductively coupled with the oscillator circuit at other points. If desired, the internal impedance of the voltage supply source 42 can be bypassed by a capacitor 43 having low impedance at oscillator frequencies. A parallel resonant circuit tuned to the oscillator frequency is also provided in the gate circuit by a parallel connected capacitor 47 and inductor 48. The tuned circuit is coupled between the gate electrode G and ground through a bypass capacitor 49 which offers low impedance at oscillator frequencies.

A gate bias voltage source is provided by a battery or other source of voltage 50 connected in parallel with a potentiometer 51 whose center tap is connected to ground. The potentiometer 51 includes an adjustable slider which is connected for D.-C. to the gate electrode G through the inductor 48.

The circuit described comprises a tuned-drain tuned-gate oscillator which produces oscillations at a frequency determined by the tuning of the gate and drain resonant circuits, and at an amplitude determined by the value of the bias applied between the gate G and the source S by the gate bias voltage source 50–51. While a certain amount of capacitance internal feedback exists between the gate and the drain electrodes, in the circuit of FIGURE 4 this internal feedback is supplemented by a feedback capacitor 46.

In considering the operation of the oscillator, it will be noted that the internal resistance between the gate and the other electrodes of the insulated-gate field-effect transistor is high and independent of the polarity of a voltage applied therebetween. Therefore, there is no loading of the oscillator by the gate circuit, whether the gate be positive or negative with respect to the other electrodes, and there is no tendency to vary the applied gate bias by gate rectification. Since the voltage is capacitively fed back to the gate electrode from the drain electrode during the operation of the oscillator, the gate voltage will vary symmetrically about its bias voltage established by the gate voltage source 50–51.

Figures 5, 6:
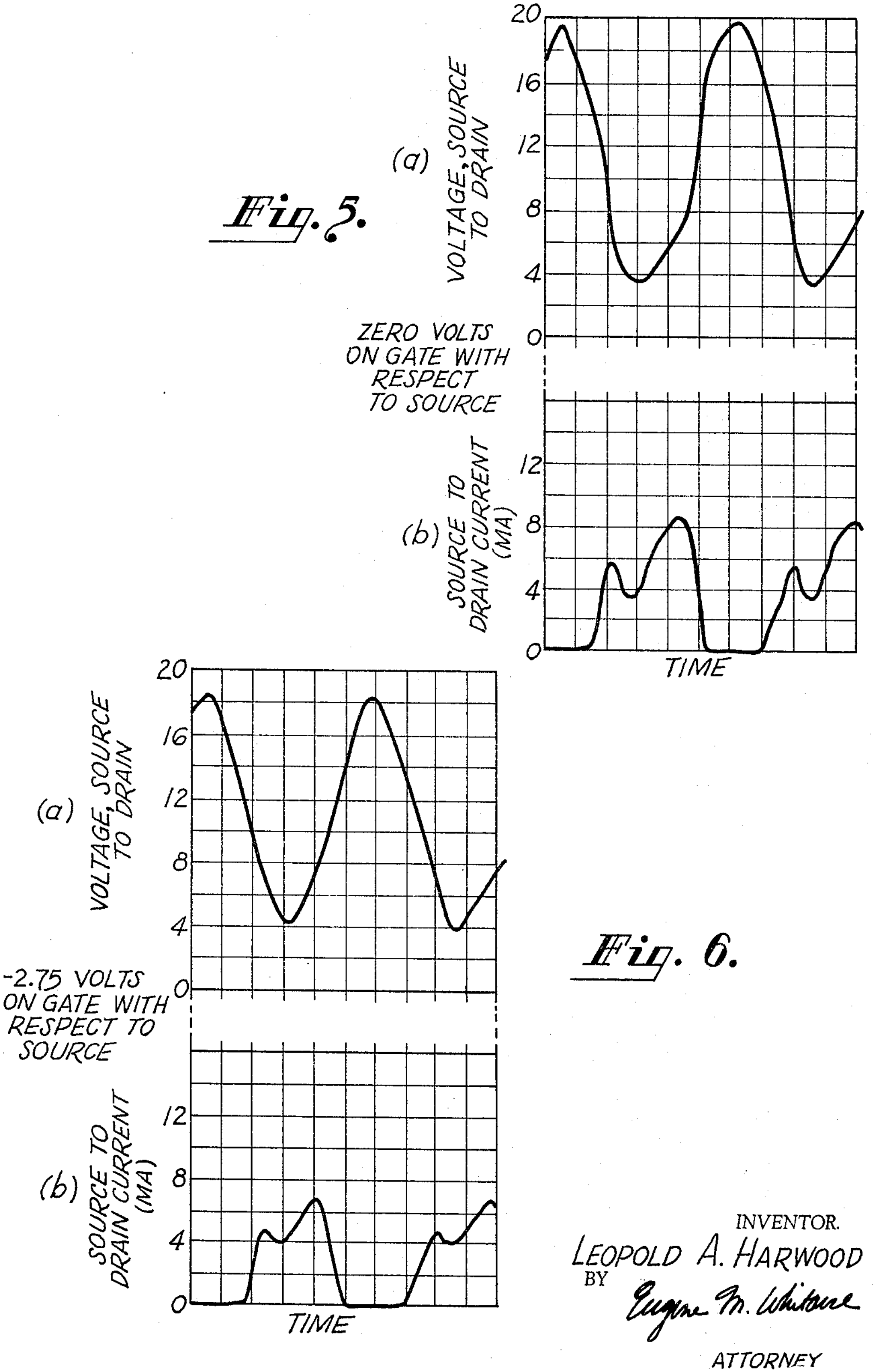
FIGURES 5–8 are curves of the drain voltage waveforms and drain current waveforms of an oscillator such as that of FIGURE 4 for different values of gate bias voltage on the transistor.
Figure 7:
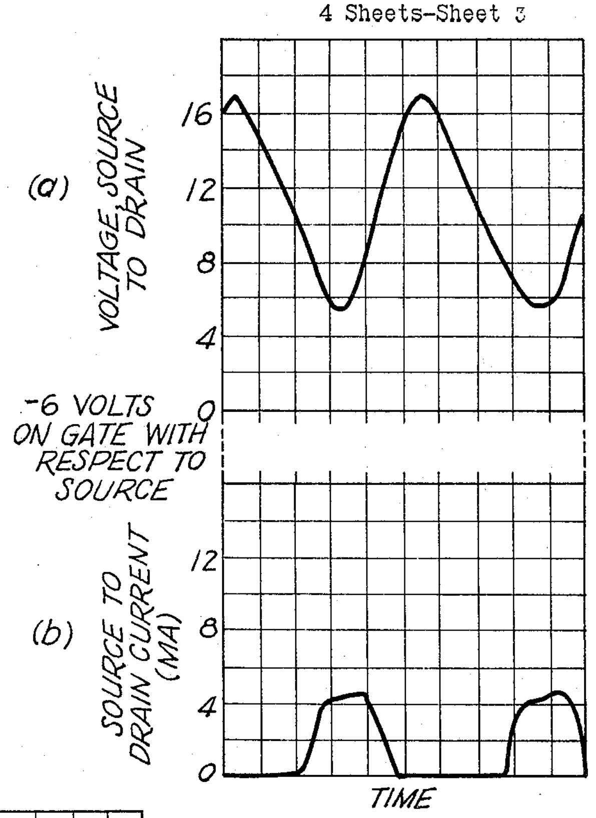

When the gate bias voltage source 50–51 of FIGURE 4 is set at zero volts bias on the gate with respect to the source, and the voltage source 43 supplies about 10 volts, then the oscillator will operate on a load line, such as line 52 of FIGURE 3. The voltage waveform as measured across the load resistor 45 is shown in FIGURE 5*a* and the drain current waveform is shown in FIGURE 5*b*. For zero bias on the gate, the voltage on the drain oscillates from about 19½ volts to about 3½ volts or through a range of about 16 volts peak-to-peak, while current flows in the source-to-drain circuit for over-two-thirds of a cycle, reaching a maximum value of about 9 ma. When the gate bias is changed to −2.75 volts, the peak-to-peak drain voltage is about 14½ volts as shown in FIGURE 6*a*, and the drain current flows for a little over one-half cycle and reaches a maximum value of about seven ma. as shown in FIGURE 6*b*. When the gate bias is changed to −6 volts, the peak-to-peak drain voltage is about 11 volts as shown in FIGURE 7*a* and the drain current flows a little over two-fifths of a cycle, reaching a maximum value of about 5 ma. as shown in FIGURE 7*b*. At −6 volts bias on the gate, the oscillator operates on the load line such as line 53 of FIGURE 3.

Figure 8:
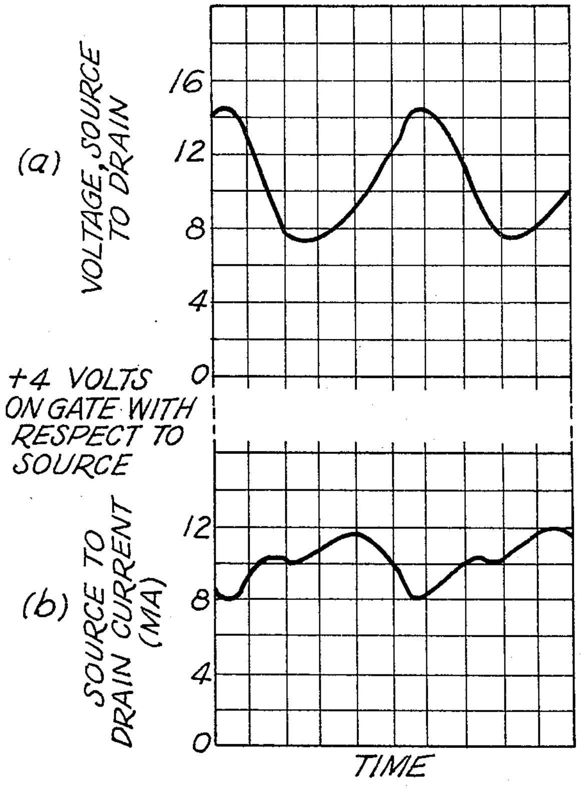

Referring to FIGURE 8, it will be noted that when the gate bias voltage is +4 volts, the peak-to-peak amplitude of oscillation is about 7 volts as shown in FIGURE 8*a* and current flows between the source and drain throughout the cycle, varying over a range of about 3 ma. as shown in FIGURE 8*b*. It was noted that the amplitude of oscillations produced by the insulated-gate field-effect transistor oscillator illustrated in FIGURE 4 varied in amplitude from a maximum value at a gate bias voltage of about minus 0.5 volt to lower values as the gate bias is made more positive or negative from this value. It was also noted that the average drain current remained the same whether the circuit was oscillatory or not for a gate bias voltage of −2.75 volts. For more negative gate bias voltages the average drain current was greater when the circuit was oscillating than it was when oscillations were damped out. For more positive gate bias voltages than −2.75 volts the average drain current was less during the oscillating condition of the circuit than the non-oscillating condition thereof.

From the foregoing, it can be seen that the amplitude of oscillation of the oscillator of FIGURE 4 is a function of gate bias voltage. It is belived that the control over the amplitude of oscillation results indirectly from the transistor being driven to limit conditions such as to cut-off or saturation. When the gate bias voltage is changed, the drain current is distorted in varying degrees which appears to be caused by drain current cut-off and/or drain current saturation. The distorted wave, which may be defined by a Fourier analysis, contains a component at the fundamental frequency of the oscillator. As the gate bias voltage is changed, the amount of the fundamental frequency component present in the drain current wave is changed. When the amount of this fundamental frequency component is maximum, the amount of feedback voltage to the gate circuit is maximum and the greatest amplitude of oscillation occurs. The gate circuit is capacity coupled to the drain circuit, and the voltage waveform at the gate circuit appears symmetrical.

Figure 9:
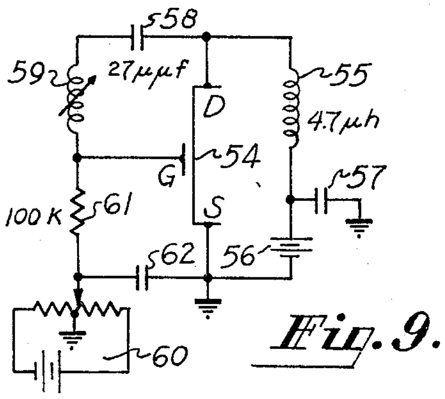
FIGURES 9, 10, 11, 12 and 15 are schematic diagrams of oscillator circuits embodying the invention.

The schematic circuit diagram shown in FIGURE 9 is a grounded source oscillator connected in a modified Colpitts configuration. The oscillator includes an insulated-gate field-effect transistor 54 which may be of the type shown and described in connection with FIGURES 1 and 2. The source electrode S is connected to ground and the drain electrode D is connected through a radio frequency choke coil 55 to the positive terminal of an operating potential supply source 56. The negative terminal of the operating supply source 56 is returned through ground to the source electrode S. A capacitor 57 which exhibits low impedance at the oscillator frequency is connected in parallel with the potential source 56.

The frequency of oscillation of the oscillator is determined by a circuit including a capacitor 58 and an inductor 59 connected in series between the drain and gate electrodes of the transistor 54. This series circuit provides an effective inductance which is in parallel with the series combination of the inherent drain-to-ground and gate-to-ground capacitances of the transistor. As shown in the drawings, the inductor 59 is adjustable to permit tuning of the oscillator.

The gate electrode G is connected to a source of direct gate bias potential 60 through an isolating resistor 61. The source of gate bias voltage potential 60, is similar to that described in connection with FIGURE 4, and includes an adjustable slider which is bypassed to ground for oscillator frequencies by a capacitor 62.

The self-starting oscillator of FIGURE 9 was operated successfully at a frequency of about 200 megacycles, and exhibited a relatively large change in the amplitude of the oscillations generated as the D.-C. voltage applied to the gate electrode was varied.

Figure 10:
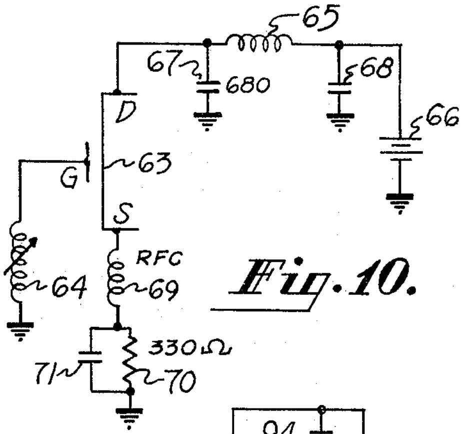

FIGURE 10 is a schematic circuit diagram of a grounded drain oscillator connected in another modified Colpitts configuration. This oscillator circuit includes an insulated-gate field-effect transistor 63 which may be of the type described in connection with FIGURES 1 and 2. The frequency of oscillation is determined by an inductor 64 which is connected between the gate electrode G and ground in parallel with the inherent gate-to-source and source-to-ground capacitance.

The drain electrode is connected through a radio frequency choke coil 65 to the positive terminal of a source of operating potential 66, the negative terminal of which is grounded. A capacitor 67 which is of low impedance at the oscillator frequency maintains the drain electrode at A.-C. ground potential, and a capacitor 68 is connected in parallel with the operating potential supply source 66 to insure that oscillator signals are not developed across the internal resistance of the operating potential supply source.

The source electrode S is connected through a radio frequency choke coil 69 and a source biasing resistor 70 to ground. The resistor 70 is bypassed for oscillator frequencies by a capacitor 71.

In the circuit of FIGURE 10, the amplitude of oscillation is predetermined by the design of the circuit. By appropriate selection of the source biasing resistor 70, and the voltage of the operating potential supply source 66, the D.-C. current through the transistor 63 can be established at a desired value. Since the source-to-drain current through the transistor also flows through the resistor 70, a voltage is developed across the resistor 70 which establishes the source-to-gate bias voltage, and therefor the amplitude of oscillation.

To be self-starting, the oscillator of FIGURE 10 should include an insulated-gate field-effect transistor which exhibits sufficient gain under zero bias conditions to overcome the losses in the circuit. By way of example, the transistor 63 may have a zero bias characteristic corresponding to the curve 30 of FIGURE 3.

A feature of the circuit of FIGURE 10 is that the gate electrode is maintained at D.-C. ground potential through the low resistance of the inductor 64. In this figure, another feature is that one terminal of the voltage supply is also maintained at ground potential.

Figure 11:
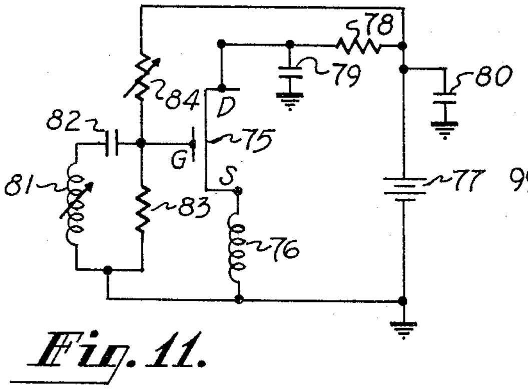

If it is desired to use an "enhancement" type of transistor having a zero bias characteristic exhibiting relatively low gain such as for the curve 35 or 37 of FIGURE 3, the circuit of FIGURE 11 may be used. The circuit of FIGURE 11 includes an insulated-gate field-effect transistor 75 which is connected in a grounded-drain modified Colpitts configuration. The source electrode S is connected to ground through a radio frequency (R.-F.) choke coil 76, and the drain electrode D is connected to a source of operating potential 77 through a voltage dropping resistor 78. The drain electrode is maintained at ground potential for signals of oscillator frequency by a capacitor 79, and the source of operating potential supply 77 is bypassed by a capacitor 80.

The gate electrode G which is connected to a frequency determining inductor 81 through a direct current (D.-C.) blocking capacitor 82 is maintained at a desired positive potential with respect to ground by a voltage divider including a pair of resistors 83 and 84 connected directly across the operating potential supply source 77.

The frequency of oscillation of the circuit shown in FIGURE 11 is determined by the inductor 81 which is effectively connected in parallel with the series combination of the gate-to-source and source-to-ground capacitances. As noted above, the frequency of oscillation may be changed by adjusting the value of the inductor 81 or by the addition of capacitors suitably connected in the circuit such as, for example, between the gate electrode and ground.

The transistor 75 is an "enhacement" transistor having a zero gate bias voltage characteristic represented by one of the curves 35–37 of FIGURE 3. The gate electrode G is maintained at a positive potential by the voltage divider 83–84 to establish the desired operating point of the transistor 75 at one of the upper curves shown in FIGURE 3. A circuit of this type is advantageous in that the same source of operating potential for polarizing the drain-to-source path of the transistor 75 may be used to establish the gate bias voltage. If desired, the resistor 84 may be made variable to adjust the gate bias voltage and thereby change the amplitude of oscillation.

Figure 12:
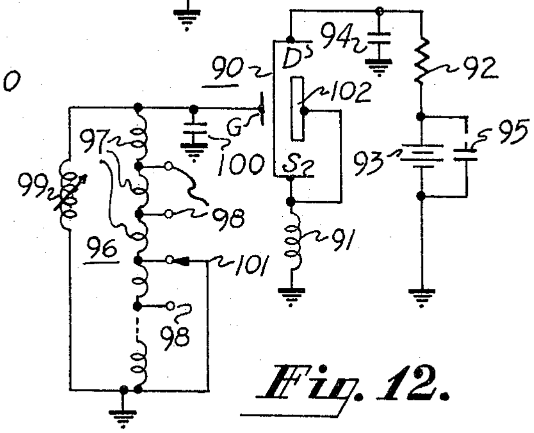

FIGURE 12 is a schematic circuit diagram of a grounded drain oscillator circuit which may be used as a local oscillator of a superheterodyne signal receiver, such as a television receiver. This circuit includes an insulated-gate field-effect transistor 90 which may be of the type shown and described in connection with FIGURES 1 and 2. A radio frequency choke coil 91 con- the source electrode S to ground, and a voltage dropping resistor 92 connects the drain electrode D to a source of operating potential 93. The drain electrode D and source of operating potential 93 are bypassed to ground for oscillator frequencies by the capacitors 94 and 95 respectively.

The tuning elements of the oscillator circuit include a plurality of serially connected inductors 97 having intermediate tapping points 98 connected between the gate electrode and ground. A fine tuning inductor 99 and a capacitor 100 are also connected between the gate electrode and ground. A rotor or short-circuiting element 101 which is adapted to be moved from one of the taps 98 to another provides step-by-step tuning for the oscillator. The physical configuration of the rotor 101, inductors 97 and taps 98 may be similar to that used in wafer-switch type television tuners.

It will be noted that substantially no D.-C. potential exists between the gate electrode G and the source electrode S and since the choke coil 91 and inductors 97 and 99 offer low resistance to direct currents. Accordingly, the transistor 90 is selected to have a zero bias operating characteristic which exhibits sufficient transconductance to be self-starting.

To enhance the efficiency of oscillation, the substrate electrode 102, which corresponds to the substrate 12 shown in FIGURES 1 and 2, is connected to the source electrode S.

Figure 13:
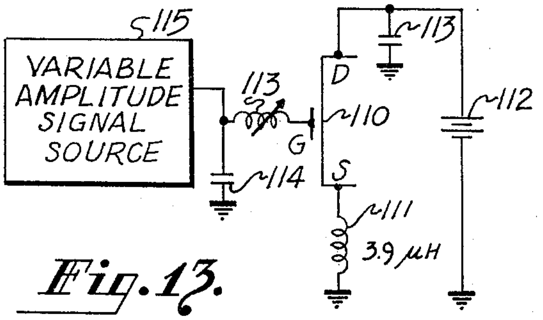
FIGURE 13 is a schematic diagram of a modulator circuit embodying the invention.

FIGURE 13 is a schematic circuit diagram of a memory or modulator circuit including an insulated-gate field-effect transistor 110 of the type shown and described in connection with FIGURES 1 and 2. The source electrode S of the transistor 110 is connected to ground through an R.-F. choke coil 111, and the drain electrode D is connected directly to the positive terminal of an operating potential supply source 112, the negative terminal of which is grounded. A capacitor 113 which exhibits low impedance at oscillator frequencies is connected in parallel with the operating potential supply source 112.

A tuning inductor 113 and a D.-C. blocking capacitor 114 are connected in series between the gate electrode G and ground. The tuning inductor 113 is effectively connected in parallel with the inherent gate-to-source and source-ground capacitances of the transistor 110 and resonates therewith at the oscillator frequency. Accordingly, the oscillator operates as a grounded-drain Colpitts oscillator.

A variable amplitude signal source 115 is connected across the D.-C. blocking capacitor 114. The internal impedance of the signal source 115 is large, and the resistance-capacitance (R.-C.) time constant of the discharge path including the signal source 115, the capacitor 114 and the input resistance of transistor 110 is very long and can be on the order of many hours. The charging circuit time constant including the source 115 and capacitor 114 is fast relative to the discharge time constant. Accordingly, a voltage pulse from the signal source 115 applied to the gate electrode G establishes a voltage at the gate electrode which will be maintained for a period of time. This voltage controls the amplitude of oscillation developed by the oscillator circuit and hence provides a memory. If a second voltage pulse is applied from the signal source 115 to the gate electrode G, changing the gate-to-source voltage, then the amplitude of oscillation is correspondingly changed and will remain at the new value for a period of time depending on the resistance-capacitance discharge time constant of the gate circuit.

As an alternative, the variable amplitude signal source 115 may provide a signal for amplitude modulating the oscillations which are developed in the circuit, and accordingly the circuit then operates as a modulator. When used as a modulator, the discharge time constant need not be as large as was mentioned above.

Figure 14:
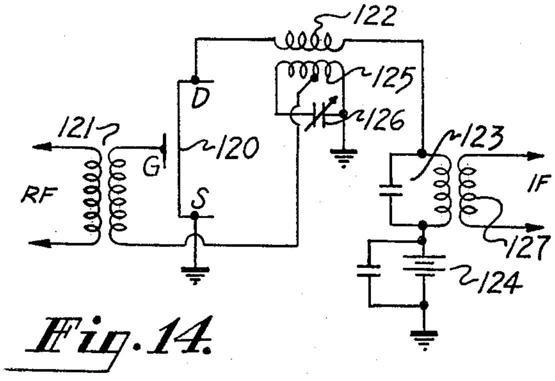
FIGURE 14 is a schematic diagram of a self-oscillating frequency converter embodying the invention.

FIGURE 14 is a schematic circuit diagram of a self-oscillating converter circuit including an insulated-gate field-effect transistor 120 of the general type described in connection with FIGURES 1 and 2. A signal modulated carrier wave from an antenna or other suitable source is applied through a coupling transformer 121 to the gate electrode G of the transistor 120. The source electrode of the transistor 120 is grounded and the drain electrode D is coupled through a feedback winding 122 and a parallel resonant intermediate frequency circuit 123 to the positive terminal of an operating potential supply source 124.

The feedback winding 122 is coupled to an inductor 125 which is tuned by a variable capacitor 126 to a frequency above or below that of the received carrier wave by an amount corresponding to the intermediate frequency signal to be developed. If desired, the input circuit may be tuned to the R.-F. signal frequency by a variable capacitor, not shown, which is ganged for unicontrol operation with the capacitor 126. Signals developed in the resonant circuit 125–126 are coupled from a tap on the inductor 125 to the gate electrode G through the secondary winding of the coupling transformer 121. This feedback voltage is of a phase and amplitude to maintain oscillation in the circuit. The non-linear interaction of the signal modulated carrier wave and the locally developed oscillator voltage in the transistor 120 produces heterodyne side band signals, as is known, and the difference or intermediate frequency side bands are selected by the tuned I.-F. circuit 123. An inductive winding 127 which is coupled to the I.-F. circuit 123 applies the intermediate frequency waves to suitable utilization circuit means such as an intermediate frequency amplifier or a detector circuit.

It will be noted that substantially zero gate-to-source bias votage exists in the circuit of FIGURE 14. Accordingly, to be self-starting, the zero bias characteristic of the transistor 120 must exhibit sufficient gain to initiate and sustain oscillation. However, for good conversion efficiency, the transistor should operate along a non-linear portion of its transfer characteristic. These two requirements are conflicting, in that for maximum gain the zero bias characteristic of the transistor should correspond to the curve 30 (for example) of FIGURE 3, and for maximum non-linearity, the zero bias characteristic of the transistor should correspond roughly to the curve 36 of FIGURE 3. A compromise is made by selecting the operating point or zero bias characteristic for the transistor 120 to correspond to the curve 33 or 34. If the transistor 120 does not have a zero bias characteristic suitable to provide a good compromise between oscillation requirements and conversion efficiency, then it is to be understood that a D.-C. bias voltage may be applied to the gate electrode G to establish the necessary operating point for the circuit.

Figure 15:
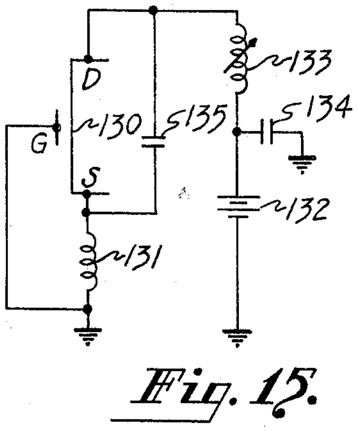

FIGURE 15 is a schematic circuit diagram of a grounded-gate oscillator including an insulated-gate field-effect transistor of the general type shown and described in connection with FIGURE 1. In this circuit, the gate G of the transistor 130 is connected directly to ground. The source S is connected to ground through a radio frequency choke coil 131, and the drain D is connected to the positive terminal of an operating potential supply source 132 through a tuning inductor 133. A capacitor 134 is provided to bypass oscillator signals around the operating potential supply source 132.

The oscillator circuit essentially comprises a modified Colpitts configuration, the tuning of which is determined by the tuning inductor 133 in parallel with the series combination of the inherent drain-to-source and source-to-ground capacitances. If desired, the drain-to-source capacitance may be supplemented by an external feedback capacitor 135.

Since substantially zero gate-to-source bias voltage exists in the circuit of FIGURE 15, the transistor 130 should have a zero bias operating characteristic which exhibits sufficient gain to initiate and sustain oscillation in the circuit. The particular amplitude of oscillations which are generated is a function of the zero bias characteristic of the transistor.

What is claimed is:

1. An oscillator circuit comprising:
an insulated-gate field-effect transistor having source, drain and gate electrodes,
circuit means interconnecting said source, drain and gate electrodes for operation of said transistor as the active element of said oscillator circuit, and
means for establishing a predetermined average amplitude of oscillation in said oscillator circuit comprising a direct current conductive circuit interconnecting said source and gate electrodes.

2. The invention as set forth in claim 1, in which:
said direct current conductive circuit maintains said gate electrode at zero direct voltage bias with respect to said source electrode.

3. An oscillator circuit comprising:
an insulated-gate field-effect transistor having source, drain and gate electrodes, said transistor having a predtermined drain current vs. drain voltage characteristic, and
circuit means interconnecting said source, drain and gate electrodes for the operation of said transistor as the active element of said oscillator circuit and for applying a selected operating potential between said source and drain electrodes, said circuit means including means for establishing a biasing voltage between said source and gate electrodes which is of a value to bias said transistor for operation at a point on its drain-current vs. drain voltage characteristic which exhibits sufficient transconductance to initiate and sustain oscillation at an average peak-to-peak amplitude, the average peak-to-peak amplitude of oscillation being a function of the gate-to-source voltage.

4. An oscillator comprising:
an insulated-gate field-effect transistor having source, drain and gate electrodes and exhibiting a curve of drain electrode current against drain electrode to source electrode voltage for zero gate electrode to source electrode bias voltage having a configuration dependent on the preparation of said transistor, and
circuit means interconnecting said source, drain and gate electrodes for the operation of said transistor as the active element of said oscillator circuit,
said circuit means including means for determining the average amplitude of oscillations in said oscillator circuit comprising a circuit path between said gate electrode and said source electrode for maintaining the bias voltage between said gate electrode and said source electrode at a predetermined value and for operation of said transistor at a point in its characteristic such that it exhibits sufficient gain at said bias voltage to sustain oscillations in said oscillator circuit at said predetermined average amplitude.

5. An oscillator circuit comprising:
an insulated-gate field-effect transistor having a gate electrode, a drain electrode and a source electrode,
a circuit interconnecting two of said electrodes,
a further circuit for interconnecting one of said two electrodes and a third electrode,
the internal capacity between two of said electrodes providing feedback whereby oscillations are produced in said oscillator circuit, and
means for setting the average amplitude of said oscillations at a predetermined value comprising means for applying a predetermined bias potential to said gate electrode with respect to said source electrode.

6. The oscillator circuit as recited in claim 5 in which said predetermined biasing potential is zero.

7. An oscillator circuit comprising:
an insulated-gate field-effect transistor having source, drain and gate electrodes,
means interconnecting said source, drain and gate electrodes for the operation of said transistor as the active element of an oscillator circuit,
said means including a potential supply connected between said drain and source electrodes, and
means for maintaining said gate electrode and one terminal of said supply at the same direct current potential.

8. An oscillator circuit comprising:
an insulated-gate field-effect transistor having source, drain and gate electrodes,
means for connecting said drain electrode to a potential reference point for alternating current waves,
means for connecting said source electrode to said reference point,
means for connecting said gate electrode to said source electrode,
one of said connections comprising a tuning means, whereby oscillations are produced in said oscillator circuit at a frequency determined by said tuning means, and
means including said connection between said gate and said source electrodes for predetermining the average amplitude of said oscillations.

9. An oscillator circuit comprising:
an insulated-gate field-effect transistor comprising a drain electrode, a source electrode and a gate electrode,
means for interconnecting said electrodes for the production of oscillations said field-effect transistor as the active element thereof, and
means for predetermining the average amplitude of said oscillations including a connection for applying one of a postive and a negative bias voltage to said gate electrode with respect to said source electrode.

10. An oscillator circuit comprising:
an insulated-gate field-effect transistor having source, drain and gate electrodes,
means for connecting said gate electrode directly to a point of reference potential for direct and alternating current,
respective impedance means having substantially no direct current impedance connecting said source and said drain electrodes to said point of reference potential, one said impedance means including a tuning means, and
feedback means connected between said source and drain electrodes, whereby oscillations are produced in said oscillator circuit at the frequency of said tuning means.

11. An oscillator circuit comprising:
an insulated-gate field-effect transistor having source, drain and gate electrodes,
circuit means including a voltage supply interconnecting said source, drain and gate electrodes for operation of said transistor as the active element of said oscillator circuit, and means for establishing a predetermined average amplitude of oscillation of said oscillator circuit comprising a voltage divider connected across said voltage supply and a connection between said voltage divider and said gate electrode.

12. An oscillator circuit including:

an insulated-gate field-effect transistor comprising a drain electrode, a source electrode and a gate electrode and a substrate, circuit means interconnecting said electrodes for the production of oscillations with the transistor as the active element thereof, and means for increasing the efficiency of oscillations of said oscillator comprising a connection between said substrate and said source electrode.

13. An oscillator including:

an insulated-gate field-effect transistor comprising a drain electrode, source electrode and a gate electrode and a substrate, circuit means interconnecting said electrodes for the production of oscillations with the transistor as the active element thereof, a point on said circuit means being connected to a point of reference potential, and means for increasing the efficiency of oscillations of said oscillator comprising a connection between said substrate and one of said source and rain electrodes.

14. An oscillator circuit including:

an insulated-gate field-effect transistor comprising a drain electrode, source electrode, a gate electrode and a substrate, circuit means interconnecting said electrodes for the production of oscillations with the transistor as the active element thereof, a point on said circuit means being connected to a point of reference potential, and means for increasing the efficiency of oscillations of said oscillator comprising a connection between said substrate and said point of reference potential.

15. In a memory device, an oscillation circuit comprising:

an insulated-gate field-effect transistor having source, drain and gate electrodes, circuit means insulating said gate electrodes from said drain and source electrodes for direct current and interconnecting said source, drain and gate electrodes for operation of said transistor as the active element of said oscillator circuit, and means for momentarily applying a potential to said gate electrode with respect to said source electrode, whereby oscillations are produced in said oscillation circuit at an amplitude determined by the amplitude of said momentarily applied potential, said oscillations continuing at said amplitude of oscillation for a substantial period after the application of said momentarily applied potential.

16. A frequency converter circuit comprising:

an insulated-gate field-effect transistor having gate, source and drain electrodes, means connecting said gate electrode to said source electrode including a first reasonant circuit and an input impedance, means for applying signal waves to said input impedance means connecting said drain electrode to said source electrode including a coupling impedence and a second resonant circuit, said first resonant circuit being coupled to said coupling impedance, and means for maintaining said gate electrode at direct current source electrode potential, whereby local oscillations are produced in said oscillator at the frequency of said first resonant circuit and beat frequency waves appear in said second resonant circuit at the frequency difference between waves applied to said input impedance and said local oscillations.

17. A frequency converter circuit comprising:

an insulated-gate field-effect transistor having source, drain and gate electrodes, means connecting said gate electrode to said source electrode for maintaining said gate at a reference direct current potential and including an input impedance and a first resonant circuit, means for applying signal waves to said input impedance, and means connecting said drain electrode to said source electrode and including a coupling impedance and a second resonant circuit and a voltage supply, a point on said voltage supply being maintained at said reference direct current potential, said first resonant circuit being coupled to said coupling impedance, whereby local oscillations are produced in said oscillator at the frequency of said first resonant circuit and beat frequency waves appear in said resonant circuit at the frequency difference between waves applied to said input impedance and said local oscillations.

18. A frequency converter comprising an insulated-gate field-effect transistor having source, drain and gate electrodes, a first circuit interconnecting said gate and source electrodes and maintaining said gate and source electrodes at the same direct current potential, a second circuit interconnecting said drain and source electrodes, one of said first and second circuits including a circuit resonant to a local oscillation frequency, said first and second circuits being coupled for feedback of oscillations between said drain and gate electrodes whereby oscillations are produced in said frequency converter circuit at said local oscillation frequency, means for applying an input wave between said gate and source electrodes.

means resonant to a wave of a frequency of the beat wave between the locally produced oscillations and the input wave coupled between said drain and source electrodes, and said transistor exhibiting sufficient gain to initiate and maintain local oscillations of a predetermined amplitude and operating along a nonlinear portion of its transfer characteristic at zero bias on said gate electrode with respect to said source electrode.

19. A frequency converter circuit comprising:

an insulated-gate field-effect transistor having source, drain and gate electrodes, a first circuit interconnecting said gate and source electrodes, a second circuit interconnecting said drain and source electrodes, one of said first and second circuits including a circuit resonant to a local oscillation frequency, said first and second circuits being coupled for feedback of oscillations whereby oscillations are produced in said frequency converter circuit at said local oscillation frequency, means for applying an input wave between said gate and source electrodes, means resonant to a wave of the frequency of the beat wave between the locally produced oscillations and the input wave coupled between said drain electrode and said source electrode, and means for establishing a predetermined amplitude of oscillations in said frequency converter circuit comprising a connection for applying a biasing potential to said gate electrode with respect to said source electrode such that the transistor exhibits sufficient gain at said gate electrode to source electrode biasing potential to initiate and sustain oscillations at said predetermined amplitude and such that said transistor operates along a nonlinear portion of its transfer charactistic.

References Cited by the Examiner

UNITED STATES PATENTS

| | | |
|---|---|---|
| 2,744,970 | 5/1956 | Shockley. |
| 3,134,912 | 5/1964 | Evans. |

References Cited by the Applicant

FOREIGN PATENTS

| | |
|---|---|
| 69,037 | France. |
| 1,163,241 | France. |
| 318,053 | Japan. |

OTHER REFERENCES

"Circuit Applications of Field Effect Transistor," Electronics, August 12, 1960, pp. 132–135.

Theory and Applications of Electron Tubes, Herbert J. Reich, McGraw-Hill, Inc., New York, 1944, p. 394.

"Using a New Device: Field-Effect Transistor Oscillators," Electronics, December 21, 1962, pp. 44–46.

KATHLEEN H. CLAFFY, *Primary Examiner.*

ROBERT H. ROSE, *Examiner.*

R. LINN, *Assistant Examiner.*